US008393885B2

(12) United States Patent
Kasumi et al.

(10) Patent No.: US 8,393,885 B2
(45) Date of Patent: *Mar. 12, 2013

(54) PROCESSING APPARATUS

(75) Inventors: Kazuyuki Kasumi, Utsunomiya (JP); Hirohisa Ota, Kawagoe (JP); Eigo Kawakami, Utsunomiya (JP); Takashi Nakamura, Tokyo (JP); Toshinobu Tokita, Utsunomiya (JP)

(73) Assignee: Canon Kabushiki Kaisha, Tokyo (JP)

( * ) Notice: Subject to any disclaimer, the term of this patent is extended or adjusted under 35 U.S.C. 154(b) by 1030 days.

This patent is subject to a terminal disclaimer.

(21) Appl. No.: 12/120,710

(22) Filed: May 15, 2008

(65) Prior Publication Data

US 2008/0254626 A1 Oct. 16, 2008

Related U.S. Application Data

(63) Continuation of application No. 11/092,228, filed on Mar. 28, 2005, now Pat. No. 7,381,272.

(30) Foreign Application Priority Data

Mar. 29, 2004 (JP) ................................. 2004-096991

(51) Int. Cl.
 *B29C 59/00* (2006.01)
 *B29C 59/02* (2006.01)
 *H01L 21/302* (2006.01)
(52) U.S. Cl. .................... 425/385; 425/215; 264/293
(58) Field of Classification Search .................. 425/385, 425/215; 264/293
See application file for complete search history.

(56) References Cited

U.S. PATENT DOCUMENTS

| 879,363 | A | * | 2/1908 | Cheney ........................ 425/215 |
| 4,312,823 | A | * | 1/1982 | Kraakman et al. ............ 264/107 |
| 4,374,077 | A | * | 2/1983 | Kerfeld ........................ 264/1.33 |
| 4,472,124 | A | * | 9/1984 | Kashihara et al. ................ 425/3 |
| 4,477,328 | A | * | 10/1984 | Broeksema et al. .......... 522/181 |
| 4,897,228 | A | * | 1/1990 | Miwa et al. .................... 264/478 |
| 4,965,118 | A | * | 10/1990 | Kodera et al. ................. 428/137 |
| 5,545,367 | A | * | 8/1996 | Bae et al. ....................... 264/401 |
| 6,280,660 | B1 | | 8/2001 | Takakuwa et al. |
| 6,334,960 | B1 | | 1/2002 | Willson et al. |
| 6,555,406 | B1 | | 4/2003 | Leung et al. |
| 6,872,268 | B2 | * | 3/2005 | David et al. ..................... 156/71 |
| 6,949,461 | B2 | * | 9/2005 | Malhotra et al. .............. 438/643 |
| 6,971,116 | B2 | | 11/2005 | Takeda et al. |

(Continued)

FOREIGN PATENT DOCUMENTS

JP 02-024848 A 1/1990
JP 05-047051 2/1993

(Continued)

OTHER PUBLICATIONS

Jun-Ho Jeong et al, "I-JV-nanoimprint lithography using an elementwise patterned stamp", Microelectronic Engineering 75 (2004) 165-171.

(Continued)

*Primary Examiner* — Joseph S. Del Sole
*Assistant Examiner* — Nahida Sultana
(74) *Attorney, Agent, or Firm* — Canon U.S.A., Inc. IP Division (57) ABSTRACT

A processing apparatus for transferring a relief pattern on a mold to a resist on a substrate through a compression of the mold against the resist, includes a supplier for supplying the resist between the substrate and the mold, and a recovery unit for recovering the resist.

6 Claims, 9 Drawing Sheets

U.S. PATENT DOCUMENTS

| | | | |
|---|---|---|---|
| 7,157,036 B2 * | 1/2007 | Choi et al. | 264/264 |
| 7,241,696 B2 * | 7/2007 | Clevenger et al. | 438/722 |
| 7,381,272 B2 * | 6/2008 | Kasumi et al. | 118/500 |
| 7,658,601 B2 * | 2/2010 | Kasumi | 425/150 |
| 7,922,960 B2 * | 4/2011 | Hiroshima | 264/496 |
| 7,976,715 B2 * | 7/2011 | Dobisz et al. | 216/11 |
| 8,016,585 B2 * | 9/2011 | Komoriya et al. | 425/385 |
| 8,087,920 B2 * | 1/2012 | Cho et al. | 425/150 |
| 8,096,802 B2 * | 1/2012 | Mori et al. | 425/385 |
| 8,187,797 B2 * | 5/2012 | Shiobara et al. | 430/324 |
| 2002/0094496 A1 | 7/2002 | Choi et al. | |
| 2002/0150398 A1 | 10/2002 | Choi et al. | |
| 2003/0215577 A1 | 11/2003 | Willson et al. | |
| 2005/0072733 A1 | 4/2005 | Consolini et al. | |
| 2006/0183395 A1 * | 8/2006 | Xu et al. | 445/50 |

FOREIGN PATENT DOCUMENTS

| | | |
|---|---|---|
| JP | 2002-086463 A | 3/2002 |
| WO | WO2004/016406 | 2/1994 |
| WO | WO2004/051714 A | 6/2004 |

OTHER PUBLICATIONS

Younana Xia, et al, "Soft Lithography", Angew. Chem. Int. Ed. 1998,3Z 550-575.

* cited by examiner

PROCESSING APPARATUS

This application is a continuation of prior application Ser. No. 11/092,228, filed Mar. 28, 2005, now U.S. Pat. No. 7,381,272, to which priority under 35 US.C. §120 is claimed. This application claims a benefit of priority based on Japanese Patent Application No. 2004-096991, filed on Mar. 29, 2004, which is hereby incorporated by reference herein in its entirety as if fully set forth herein.

BACKGROUND OF THE INVENTION

The present invention relates generally to processing apparatuses, and more particularly to a processing apparatus that transfers a pattern on a mold as an original onto a substrate such as a wafer. The present invention is particularly suitable for a processing apparatus that uses the nanoimprint technology.

The nanoimprint technology is one alternative to the photolithography that uses the ultraviolet ("UV") light, X-rays and electron beams to form fine patterns for semiconductor devices. The nanoimprint presses (or stamps) a model (or a mold), on which a fine pattern has been formed by the electron-beam exposure etc., against a substrate such as a wafer to which a resinous material (resist) is applied, thereby transferring the pattern onto the resist. See, for example, S. Y. Chou, et al., Science, Vol. 272 pp. 85-87, 5 Apr. 1996. It is already demonstrated that the nanoimprint can transfer a fine shape of about 10 nm, and attracts attention especially as a fine periodic pattern forming means for magnetic recording media. Active researches and developments are globally under way.

The nanoimprint sometimes uses the vacuum environment to prevent intrusions of air bubbles between a mold and a substrate. Methods that facilitate the resist flow at the press time include a (heat cycle) method of heating polymer as the resist more above the glass transition temperature for transfer, and a (photo-curing) method of exposing and curing the UV curable resin as the resist while pressing it with a transparent mold, and of releasing the mold.

A manufacture of semiconductor integrated circuits ("ICs") requires an overlay that transfers the next pattern with a precise alignment with a circuit pattern already formed on a substrate. The heat cycle method heats the resist, causes the substrate and mold to thermally expand with a temperature rise, and has difficulties in maintaining the overlay accuracy. Accordingly, the photo-curing method, in which temperature control is relatively easy, is more suitable in applying the nanoimprint to the manufacture of the semiconductor ICs.

For the minimum critical dimension ("CD") of a semiconductor IC pattern of 100 nm or less, the resist requires a low-viscosity material to fully fill in the mold's fine structure. A nanoimprint apparatus typically successively transfers a pattern onto a wafer surface in a step-and-repeat manner. Here, the "step-and-repeat manner" is one mode of exposure method that moves a wafer stepwise to an exposure area for the next shot every shot of cell projection onto the wafer. However, due to the low viscosity of the resist, it is difficult to previously apply resist to a substrate, transport and mount the substrate as in an exposure apparatus. One proposed method drops a proper quantity every time the mold is pressed in transferring each shot. See, for example, M. Colburn, S. Johnson, M. Stewart, S. Damle, T. Bailey, B. Choi, M. Wedlake, T. Michaelson, S. V. Sreenivasan, J. G. Ekerdt and C. G. Willson. "Step and Flash Imprint Lithography: A new approach to high resolution patterning." Proc. SPIE 3676 (I): 379 (1999).

The mold includes plural patterns for plural chips, and generally has a rectangular shape, whereas a wafer has a circular shape. Therefore, in transferring a mold pattern matrix-wise onto a wafer, the mold outstretches the wafer's peripheral shot (referred to as a "peripheral shot" hereinafter) that is smaller than the mold size, thus resulting in a partial transfer of the mold pattern. The partial transfer of the mold pattern to the peripheral area is economical and beneficial because some of the plural chip patterns in the mold are transferred.

However, the low-viscosity resist flows out from the peripheral shot, and contaminates the processing apparatus and the wafer chuck for fixing the wafer. Thus, uneconomically, the prior art cannot transfer the mold pattern to the peripheral shot.

BRIEF SUMMARY OF THE INVENTION

The present invention is directed to a processing apparatus that has good overlay accuracy, fine processing and economical efficiency, and can prevent resist's contaminations.

A processing apparatus according to one aspect of the present invention for transferring a relief pattern on a mold to a resist on a substrate through a compression of the mold against the resist, includes a supplier for supplying the resist between the substrate and the mold, and a recovery unit for recovering the resist.

A processing apparatus according to another aspect of the present invention for transferring a relief pattern on a mold to a resist on a substrate through a compression of the mold against the resist, includes a support for supporting the substrate arranged on a more upstream side than the mold in terms of a gravitational direction.

A device manufacturing method according to still another aspect of this invention including the steps of transferring a pattern onto resist on a substrate using the above processing apparatus, and etching the substrate. Claims for the device manufacturing method that exhibits operations similar to those of the above processing apparatus cover devices as their intermediate products and finished products. Such products include semiconductor chips, CCDs, LCDs, magnetic sensors, thin-film magnetic heads, etc.

Other objects and further features of the present invention will become readily apparent from the following description of the embodiments with reference to accompanying drawings.

DETAILED DESCRIPTION OF THE PREFERRED EMBODIMENTS

Figure 1:
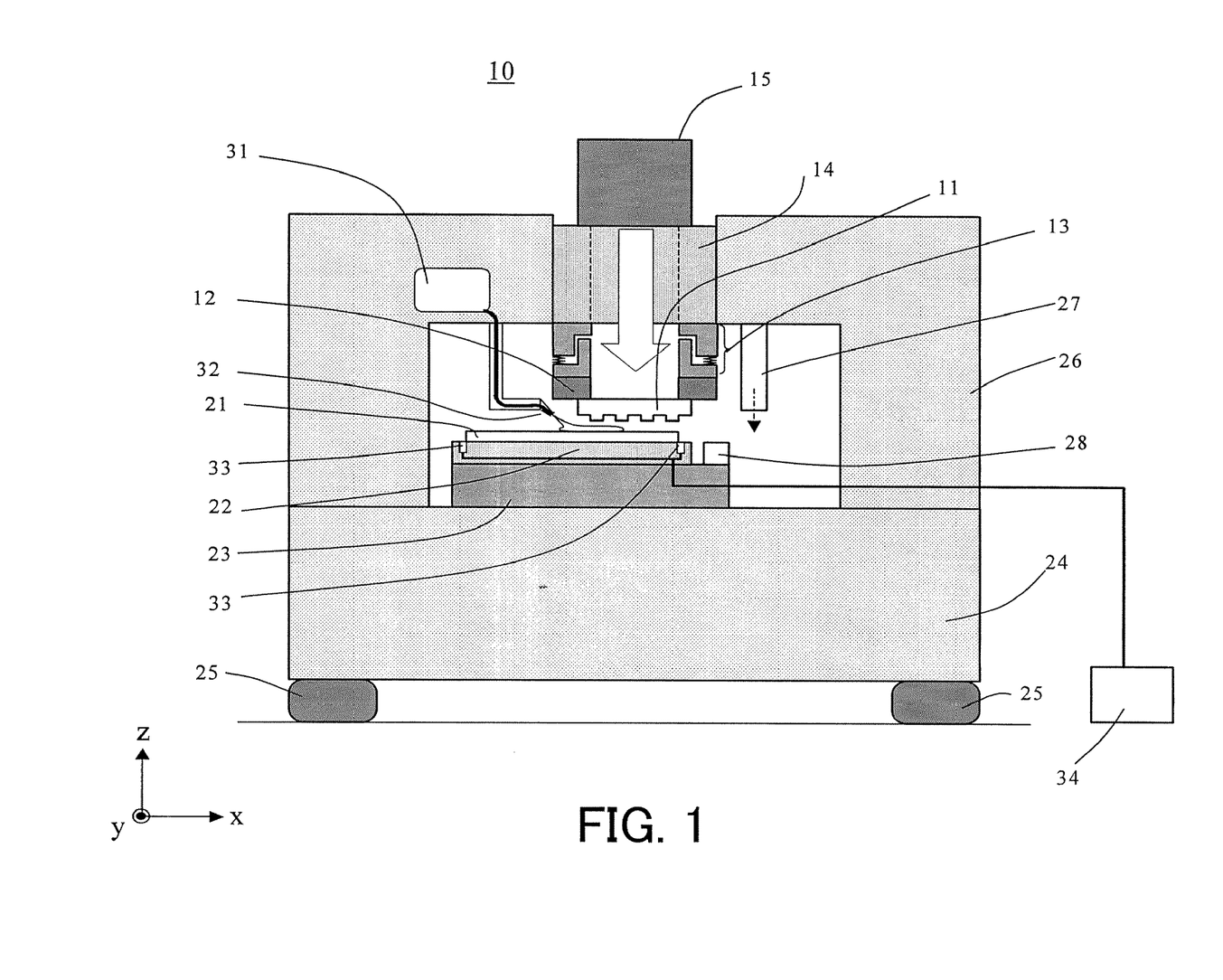
FIG. 1 is a schematic sectional view of a processing apparatus according to a first embodiment of this invention.

Referring now to the accompanying drawings, a description will be given of a photo-curing nanoimprint apparatus 10 according to a first embodiment of this invention. In each figure, the same reference numeral denotes the same element, and a duplicate description thereof will be omitted. Here, FIG. 1 is a schematic sectional view of the nanoimprint apparatus 10.

The nanoimprint apparatus 10 has a photo-curing means, a mold 11, a mold driver, a wafer 21, a wafer driver, a resist supply means, a resist recovery means, and other mechanisms.

The photo-curing means is a means that irradiates the UV light to a resist 42 via the mold 11, having a light source 15 and an illumination optical system 14. The light source 15 includes a mercury lamp (not shown), and the like that generate the UV light. The illumination optical system 14 includes lenses and apertures that shape the illumination light for exposing and hardening the resist and irradiating a resist surface, a shutter that switches between a light irradiation state and a light shielding state.

The mold 11 has a fine structure to be transferred, and is made of a transparent material such that it transmits the exposure light for hardening resist.

The mold driver includes a mold chuck 12 for holding the mold 11 on the apparatus 10, and an imprint mechanism 13 as a driver that presses the mold 11 downward. The imprint mechanism 13 moves the mold 11 longitudinally, and controls an orientation of the mold 11 and an alignment between the mold 11 and the wafer 21 for close contact between the mold transfer surface and the wafer 21.

The wafer 21 is an object onto which a pattern on the mold 11 is transferred, and which is made into a semiconductor IC through the subsequent steps.

The wafer driver includes a wafer chuck 22 that holds the wafer 21, and a wafer stage 23 for adjusting the position and orientation of the wafer chuck 22. The wafer stage 23 moves in XY plane directions, and enables the whole area of the wafer to be transferred. The wafer stage 23 provides a precise alignment, and overlay of a fine pattern. The wafer stage 23 serves to position the wafer 21, and adjust the orientation of the wafer 21's surface.

The resist supply means includes a tank 31 that stores resists 41, 42 that have not yet received the UV light or have not yet been cured, a nozzle 32 for dropping the resist on the wafer surface, and a valve (not shown) that drops or stops dropping the resist 42 from the nozzle 32.

The resist recovery means includes a recovery port 33 and a recovery unit 34. The recovery port 33 is provided in the surface of the wafer chuck 22 to attract and recover the resist 42 spilt from the wafer surface. The recovery unit 34 includes a vacuum pump, a filter, etc. (any of them not shown), and recovers the resist by setting the downstream of the recovery port to the negative pressure.

Other mechanisms include a stool 24, a damper 25, a frame 26, an alignment scope 27, and a reference mark table 28. The stool 24 supports the whole apparatus 10 as well as forming a reference plane for the wafer stage 23 to move along. The damper 25 serves to eliminate vibrations from the floor, supporting the stool 24. The frame 26 supports components from the light source 15 to the mold 11 above the wafer 21. The alignment scope 27 measures a position of an alignment mark on the wafer 21, and positions the wafer stage 23 based on the result. The reference mark table 28 has a reference mark used for an alignment between the coordinate of the alignment scope 27 and the coordinate of the wafer stage 23.

In operation, the wafer 21 to be transferred is mounted on the wafer chuck 22 by a wafer feed system (not shown). The wafer chuck 22 holds the wafer 21 through the vacuum attraction means. The alignment scope 27 sequentially measures alignment marks on the wafer surface supported by the wafer stage, measuring the position of the wafer 21 with high precision. Each transfer coordinate is computed based on the measured results. Based on the results, a transfer is sequentially provided in a step-and-repeat manner. After all the transfers are completed, the wafer 21 is fed out and the next wafer 21 is fed in.

In transfer, before the wafer is moved to the transfer position, the nozzle 32 drops an adequate amount of resist to the transfer position. The wafer stage 23 then moves and positions the wafer 21 to the transfer position. Upon completion of the positioning, the imprint mechanism 13 descends the mold 11, and presses it against the wafer 21. A load sensor in the imprint mechanism 13 determines a completion of the pressing. After the mold is pressed, the illumination light is irradiated and cures the resist 42. After the resist is cured, the mold 11 is pulled up and moved to the next transfer position (or shot).

Figure 3A:
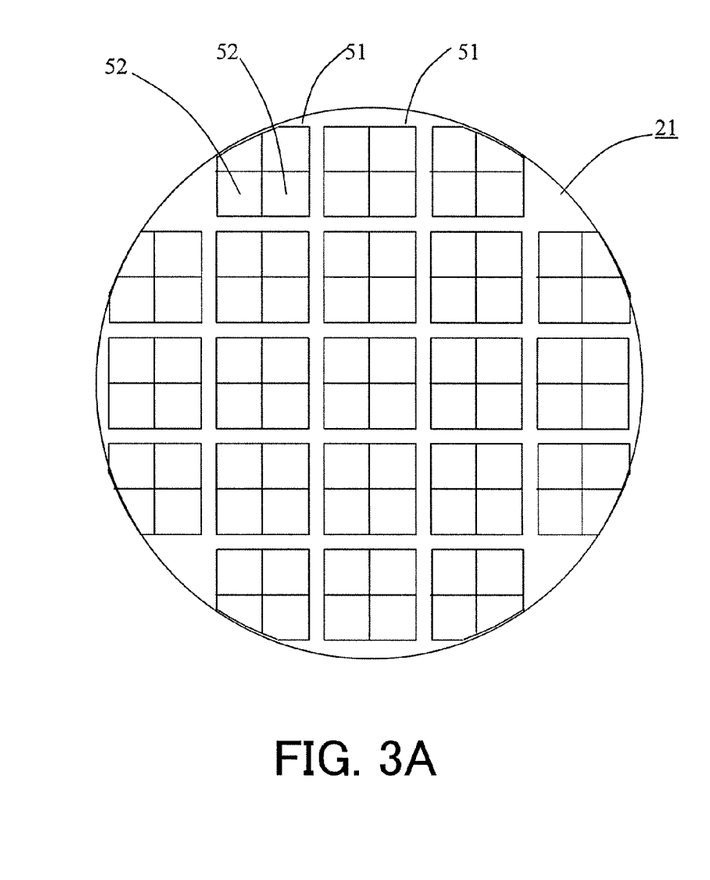
FIGS. 3A and 3B are schematic plan views showing a shot layout of a wafer.

A detailed description will now be given of a transfer to a peripheral shot. FIG. 3A shows a shot layout of the wafer 21. 51 denotes areas patterned by the mold 11, i.e., an area (shot) that is formed by a one mold pressing and exposure light irradiation. Each shot has four similar patterns 52, and each pattern 52 corresponds to one semiconductor chip. For convenience of explanation, 52 is referred to as a chip. In other words, a four device patterns (chips 52) are transferred per shot. The layout in FIG. 3A is an example of 21 shots. The shot layout of FIG. 3A includes peripheral shots at the wafer's periphery to which a complete pattern cannot be transferred. However, it is understood that two chips out of four in the peripheral shot are not defective and thus can be effectively used.

Figure 2:
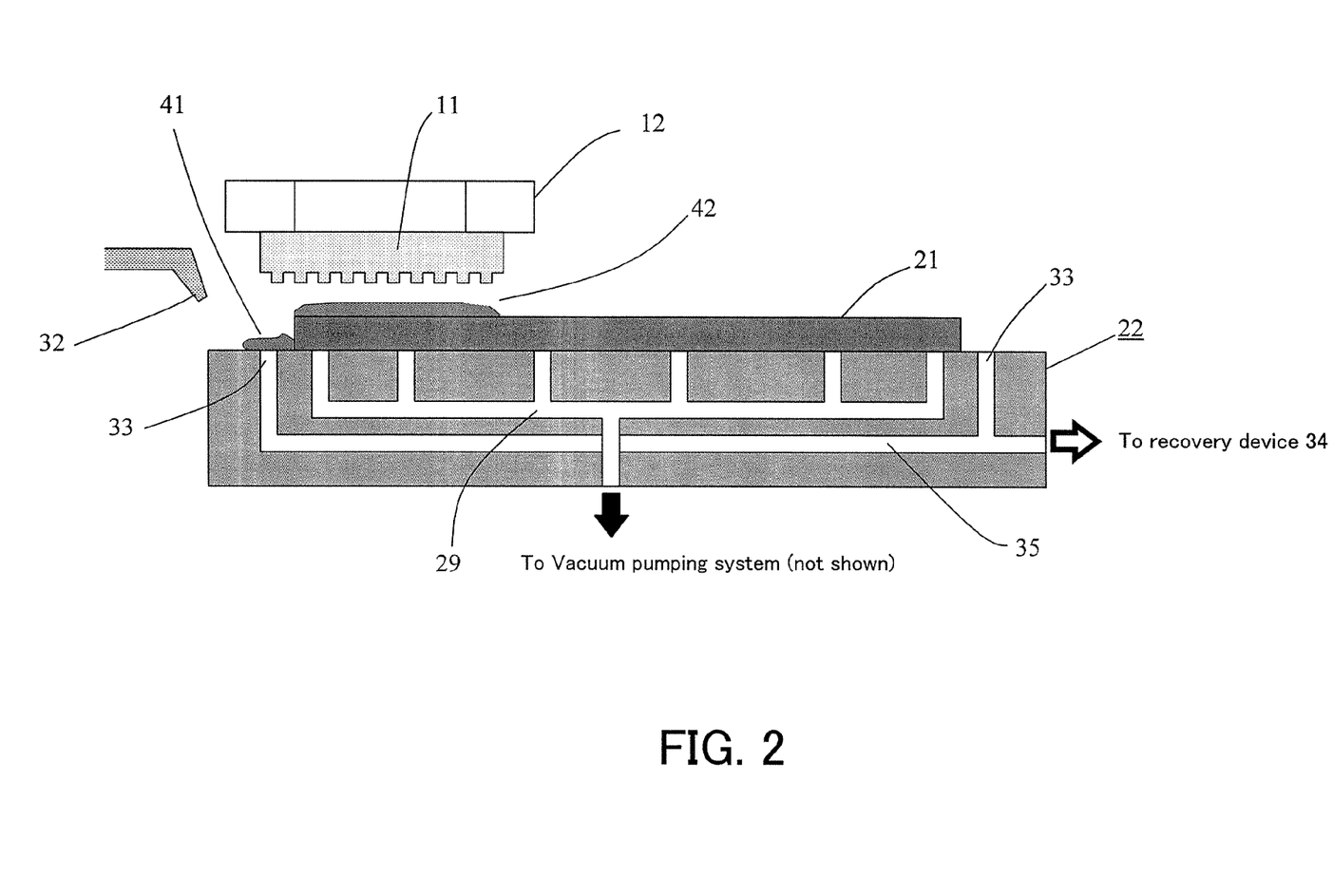
FIG. 2 is an enlarged sectional view of a resist recovery means for the processing apparatus shown in FIG. 1.

Referring now to FIG. 2, a further detailed description will be given of the peripheral shot. Here, FIG. 2 is a sectional view of the wafer chuck 22. The mold 11 is ready to be pressed after aligned. The surface of the wafer chuck 22 is provided with openings that attract the wafer 21, and are connected to a vacuum pumping system (not shown) through a vacuum attracting pipe 29 in the wafer chuck 22. A valve (not shown) in the pipe opens and closes so as to fix and release the wafer.

Figure 3B:
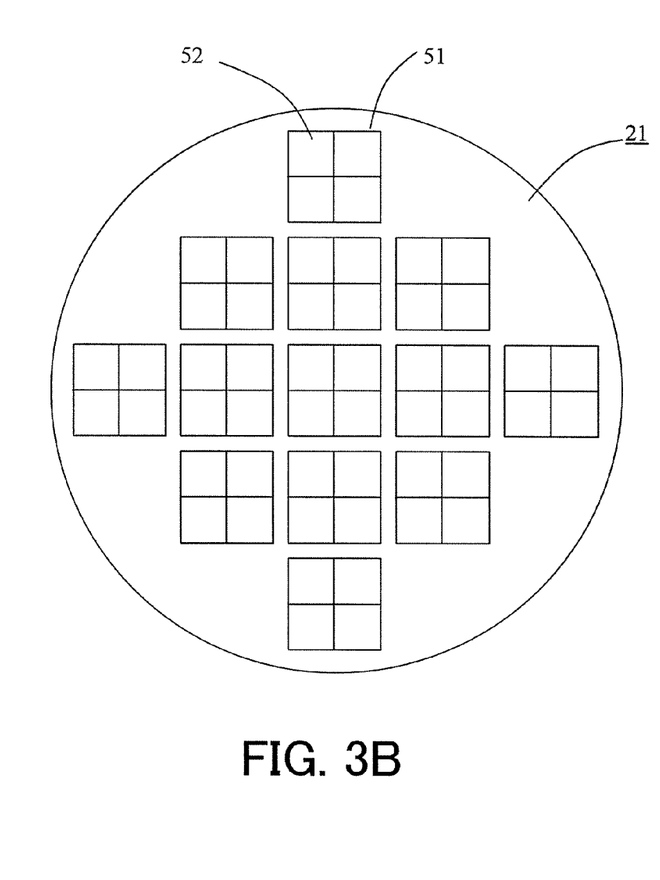

The recovery port 33 as a groove in the surface of the wafer chuck 22 extends along the wafer's circumference, and is connected to a recovery pipe 35. The recovery unit 34 attracts the applied resist 41 that is spilt from the wafer 21 through the recovery port 33 and the recovery pipe 35 for recovery. As a result, the recovery port 33 recovers the resist 41 that flows out of the wafer 21 in transferring to a peripheral shot, and protects the inside of the apparatus from contaminations by the resist 41. This configuration achieves a transfer of a pattern to a peripheral shot, maximizing the wafer, and provides more valid semiconductor chips by 16 per wafer than the layout shown in FIG. 3 in which no peripheral shots are transferred so as to prevent the resist from flowing out of the wafer. Here, the layout of FIG. 3B is a conventional example of 13 shots, which has no peripheral shots.

Figure 4:
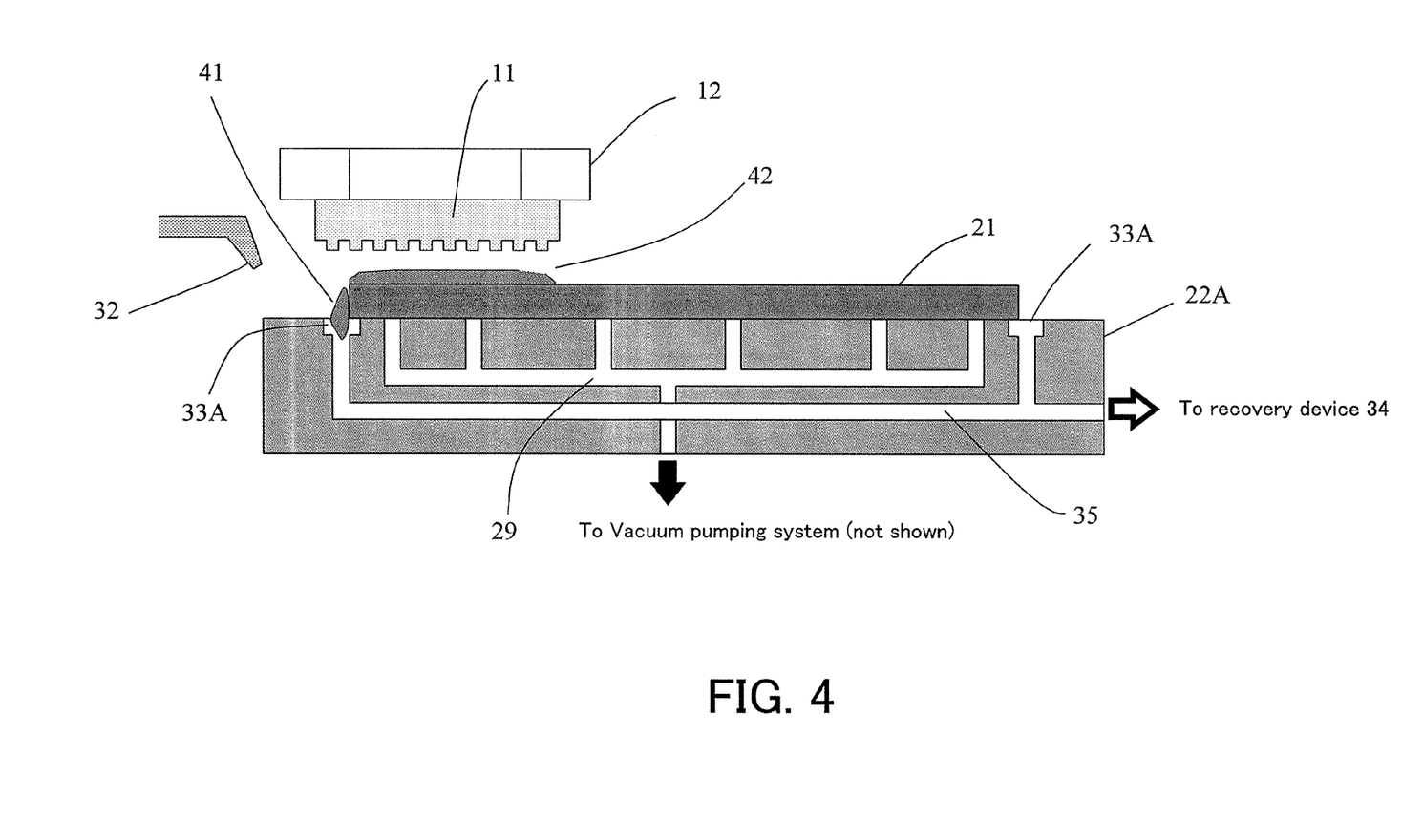
FIG. 4 is a schematic sectional view showing a resist recovery means applicable to a processing apparatus as a second embodiment of this invention.

FIG. 4 shows a sectional view of a resist recovery means (a wafer chuck 22A) according to a second embodiment applicable to the nanoimprint apparatus similar to the first embodiment, and illustrates only the wafer chuck 22A's structure. Components in FIG. 4 other than the recovery port 33A are similar to those in the first embodiment in FIG. 2, and thus a duplicate description thereof will be omitted. The recovery port 33A is formed on the wafer chuck 22A. An annular groove as the recovery port 33A extends along the wafer 21's outer circumference on its attracting surface. The groove's outer circumference is larger than the wafer's, and the groove's inner circumference is smaller than the wafer 21's contour. As shown in FIG. 4, when the wafer chuck 22A holds the wafer 22, the recovery port 33A abuts the back surface of the wafer 21's outer circumference (wafer attracted surface). The recovery port 33A enables the recovery port 33A to directly and securely recover the resist 41 that flows down when the peripheral shot is transferred. The wafer chuck 22A has a reduced supporting area for the wafer's backside, but can securely recover the resist 41.

Figure 5:
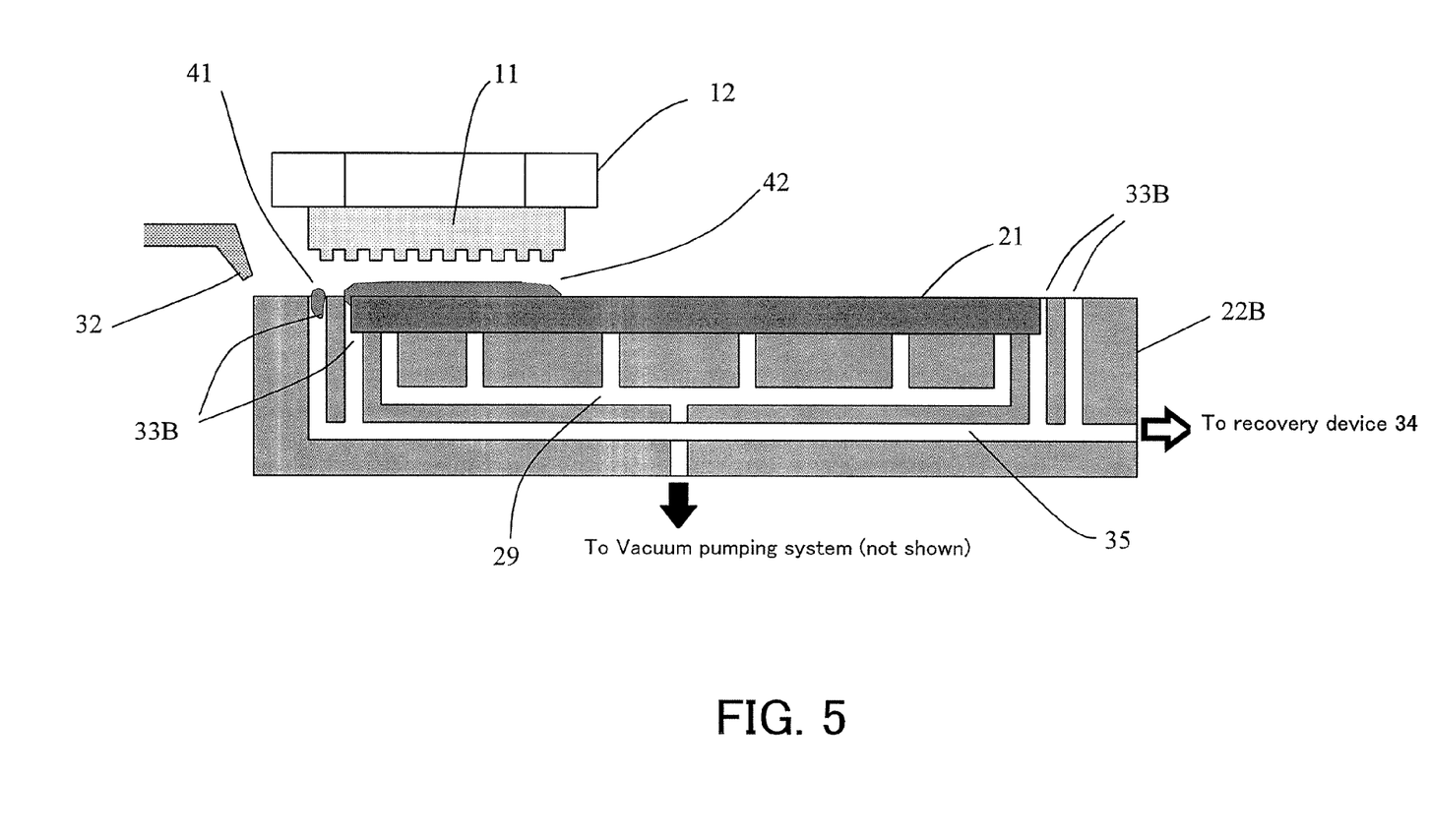
FIG. 5 is a schematic sectional view showing a resist recovery means applicable to a processing apparatus as a third embodiment of this invention.

FIG. 5 shows a sectional view of a resist recovery means (wafer chuck 22B) according to a third embodiment. Similar to the first and second embodiments, it is applied to the nanoimprint apparatus, and FIG. 5 shows only the structure of the wafer chuck 22B. Elements in FIG. 5 other than the recovery port 33B are similar to those in the first embodiment in FIG. 2, and thus a duplicate description thereof will be omitted.

The wafer chuck 22B has a concave shape with a center dent, and the dent is the surface of the wafer chuck. The size of difference in level is so set that when the wafer 21 is held, the surface of the wafer and the height of the wafer chuck's periphery are about the same level of surface. This configuration equally presses the entire pattern surface of the mold that transfers the pattern to the peripheral shot and realizes a highly accurate transfer. As shown in FIG. 5, the recovery port 33B surrounds the circumference of the wafer 21 and extends to the rise higher than the wafer 21. When viewed from the top, the surface of the wafer chuck 22B forms double rings. The inner recovery port recovers the resist that flows outside the wafer, and the outer recovery port recovers the resist that the inner recovery port could not recover. This configuration also recovers resist 41 that drops outside the wafer. The double recovery ports on and outside the wafer can securely recover the splitting resist.

Figure 6:
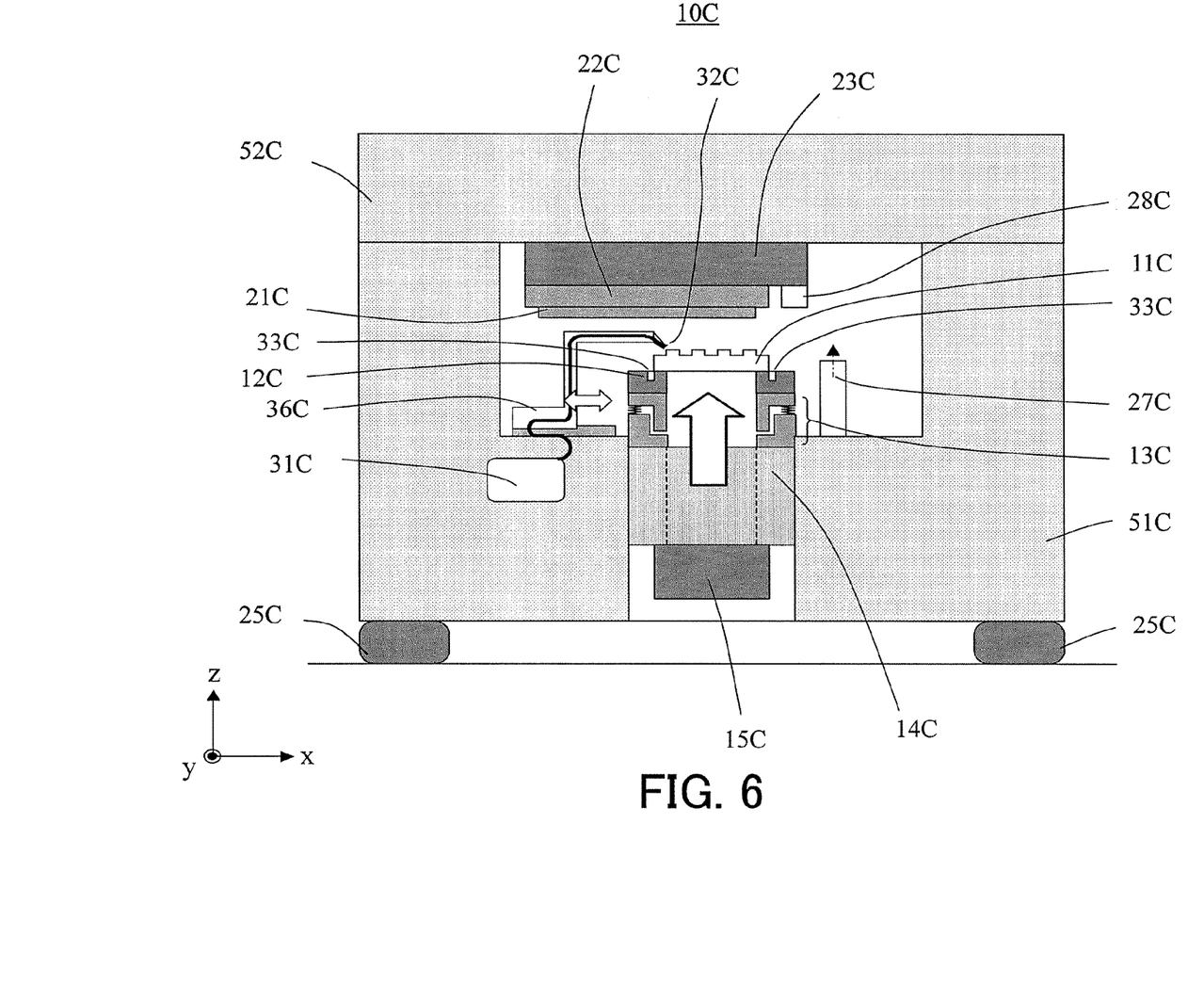
FIG. 6 is a schematic sectional view of a processing apparatus as a fourth embodiment of this invention.
Figure 7:
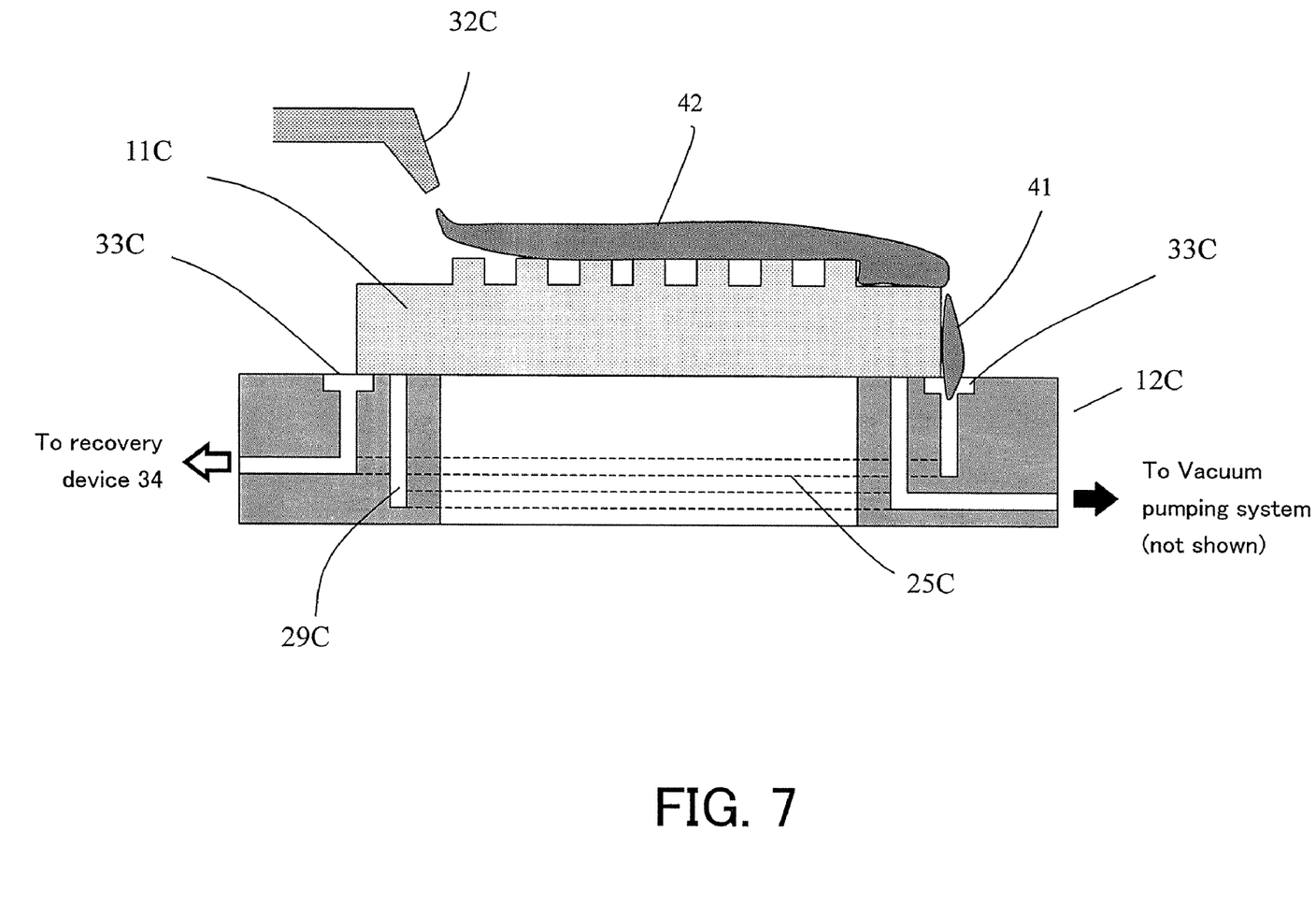
FIG. 7 is an enlarged sectional view of a resist recovery means for the processing apparatus shown in FIG. 6.

FIG. 6 shows a schematic sectional view of a photo-curing nanoimprint apparatus 10C as an example of processing apparatus of a fourth embodiment, and FIG. 7 is an enlarged sectional view near the mold 11C. The apparatus 10C mainly includes elements supported by a mainframe 51C and a stage support frame 52C. While the above embodiments locates the wafer stage 23 movable on an XY plane below the mold 11 and presses the mold 11 against the wafer while facing its pattern surface down during the transfer, the apparatus 10C locates the wafer stage 23C above the mold 11C and holds the mold 11C with its pattern surface facing up. In transfer, the mold 11C is elevated from the bottom to the wafer 21C that faces down, and pressed against the wafer 21C.

A light source 15C, an illumination optical system 14C, an imprint mechanism 13, and a mold chuck 12C are held in the mainframe 51C. The stage support frame 52C is connected to the mainframe 51C. The stage support frame 52C supports and hangs the wafer stage 23C. Except for the reverse positional relationship between the mold 11C and the wafer 21C, the fundamental roles of each element are the same as those in the foregoing embodiments. The apparatus 10C is different from the apparatus 10 and others in that the apparatus 10C includes a nozzle driver 36C. While the above embodiments moves the wafer stage 23 moves to the fixed nozzle position and drops the resist on a predetermined shot position, this embodiment always drops the resist 42 on the mold 11C.

A pattern transfer to the wafer 21C utilizes the step-and-repeat manner as in the foregoing embodiment. A description will now be given of an operation to each shot. Since the resist 42 is dropped on the mold 11C rather than the wafer 21C, some operations are different from those in the prior art. In dropping the resist, the nozzle 32C is moved above the mold. After a transfer to the previous shot is finished and the mold 11C moves down, the nozzle driver 36C moves the nozzle 32C above the mold. Then, the nozzle 32C drops the resist 42. The nozzle may move and drop the resist for uniform dropping of the resist on the pattern surface of the mold 11C. Upon completion of dropping the resist 42, the nozzle driver 36C retreats the nozzle 32C and prevents the interference between the nozzle 32C and the mold 11C when the mold 11C is being elevated and pressed against the wafer 21C. The imprint mechanism 13C has a z stroke enough to introduce the nozzle 32C between the wafer 21C and the mold 11C.

In operation, after the mold 11C moves down, the nozzle 32C moves above the mold 11C, and drops an adequate amount of resist 42. The nozzle 32C retreats after dropping the resist. The mold 11C is moved up and pressed against the wafer 21C. During pressing, the illumination light is irradiated via the light source 15C and the illumination optical system 14C, and cures the resist 42. Then, the mold 11C moves down. The resist 42 that forms a pattern remains on the wafer surface. The wafer stage 23C is moved to the next shot position.

With reference to FIG. 7, the nozzle 32C moves above the mold 11C and drops the resist 42. The mold chuck 12C holds the mold 11C through vacuum attractions. A vacuum attraction pipe 29 is installed in the mold 11C, and connected to a vacuum pumping system (not shown). A recovery port 33C having the same size and shape as those of the mold is provided around the circumference of the mold 11C. The groove is cut along the circumference of the mold 11C, and connected to the recovery unit 34, which can recover the resist that flows out of the mold 11C and into the recovery port 33C. The central part of the mold chuck 12C has an opening for the illumination light for curing the resist to pass through. The resist 41 from the nozzle 32C when spilling from the mold 11C is a contamination source in the apparatus 10C, and thus recovered from the recovery port 33C. The recovery port extends along the circumference of the mold 11C, and recovers the resist 41 without fail.

Thus, a pattern transfer with the mold pattern surface facing upward and a recovery of the resist through the mold chuck protect the wafer 21 from contaminations by the resist. While this embodiment provides the mold chuck 12C with the opening, the present invention is not limited to this embodiment and may use a different recovery means such as a pail structure around the circumference of the mold chuck 12C.

Figure 8:
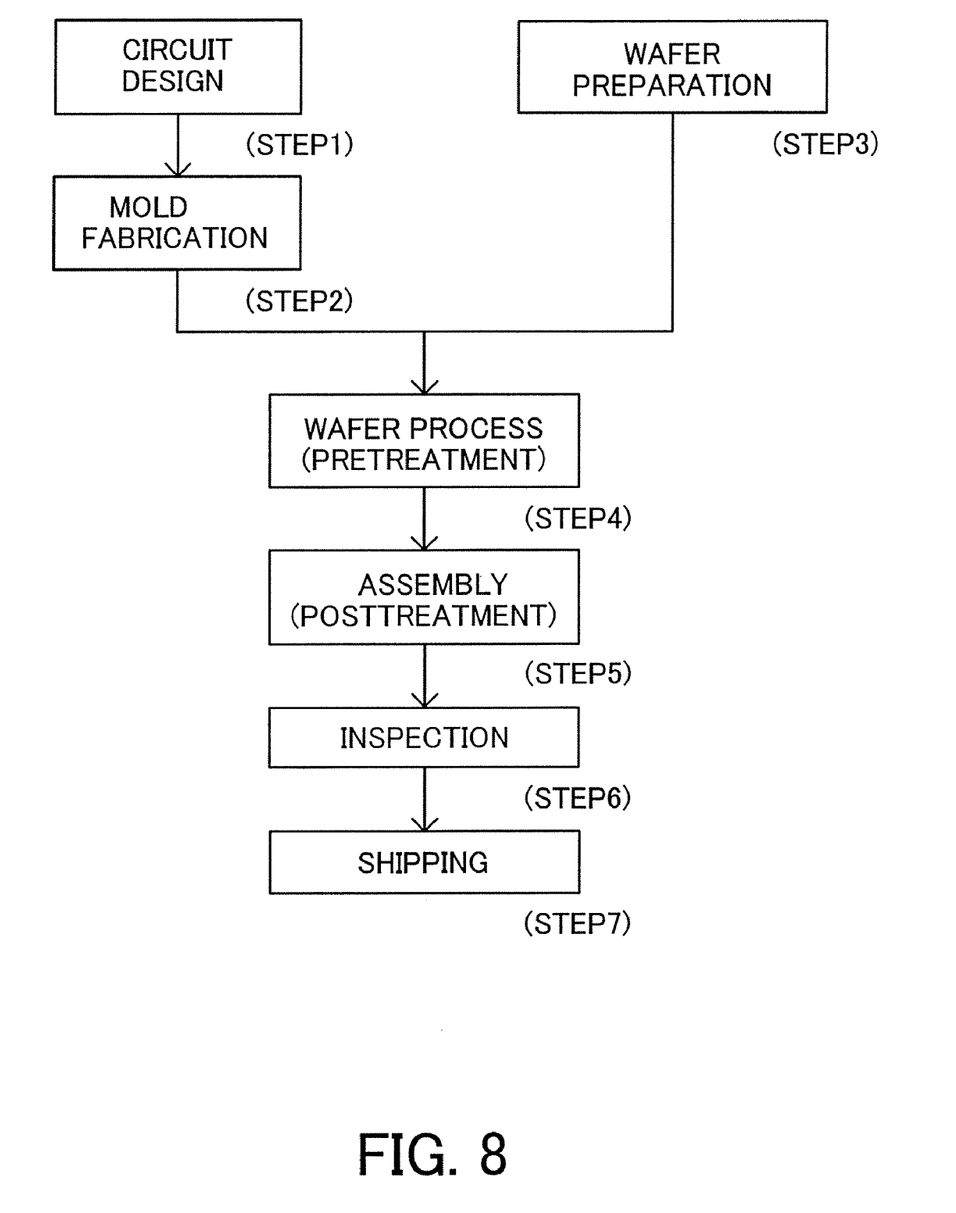
FIG. 8 is a flowchart for explaining a method for manufacturing a device (semiconductor chips such as ICs, LSIs, and the like, LCDs, CCDs, etc.) using the above processing apparatus.
Figure 9:
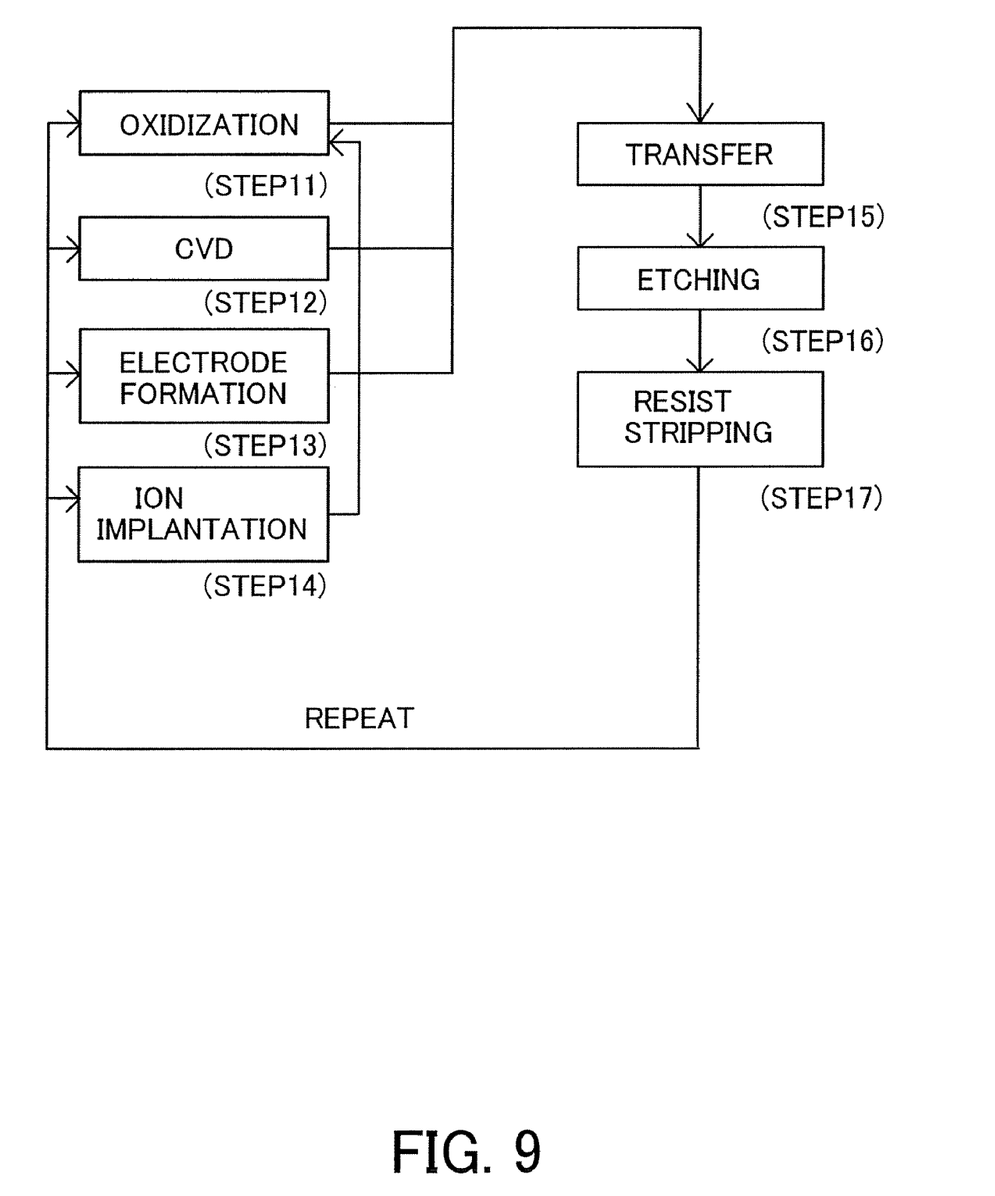
FIG. 9 is a detailed flowchart for Step 4 shown in FIG. 8.

Referring now to FIGS. 8 and 9, a description will be given of an embodiment of a device manufacturing method using the above nanoimprint apparatus 10. FIG. 8 is a flowchart for explaining how to fabricate devices (i.e., semiconductor chips such as IC and LSI, LCDs, CCDs, etc.). Here, a description will be given of the fabrication of a semiconductor chip as an example. Step 1 (circuit design) designs a semiconductor device circuit. Step 2 (mold fabrication) forms a mold that forms a pattern corresponding to a designed circuit pattern. Step 3 (wafer preparation) manufactures a wafer using materials such as silicon. Step 4 (wafer process), which is also referred to as a pretreatment, forms actual circuitry on the wafer through the nanoimprint technique using the mold and wafer. Step 5 (assembly), which is also referred to as a post-treatment, forms into a semiconductor chip the wafer formed in Step 4 and includes an assembly step (dicing and bonding), a packaging step (chip sealing), and the like. Step 6 (inspection) performs various tests for the semiconductor device made in Step 5, such as a validity test and a durability test. Through these steps, a semiconductor device is finished and shipped (Step 7).

FIG. 9 is a detailed flowchart of the wafer process in Step 4. Step 11 (oxidation) oxidizes the wafer's surface. Step 12 (CVD) forms an insulating film on the wafer's surface. Step 13 (electrode formation) forms electrodes on the wafer by vapor disposition and the like. Step 14 (ion implantation) implants ions into the wafer. Step 15 (transfer) presses the mold against the wafer while applying a photosensitive material to the wafer, and irradiates the UV light to transfer the circuit pattern onto the wafer. Step 16 (etching) uses reactive ion etching (RIE) to complete the patterning operation. Step 17 (resist stripping) removes disused resist after etching. Thus, devices (i.e., semiconductor chips, LCD devices, photographing devices (such as CCDs, etc.), thin-film magnetic heads, and the like) are fabricated. These steps are repeated, and multi-layer circuit patterns are formed on the wafer. The device manufacturing method of this embodiment uses the photo-curing method and maintains the high overlay accuracy. In addition, the use of the low-viscosity resist easily covers a fine mold pattern realizing the fine processing, and a transfer of the mold pattern to the peripheral shot improves the economical efficiency. Moreover, a recovery of the resist can prevent the contamination of the apparatus and wafer, providing high-quality devices. Thus, the device manufacturing method using the nanoimprint technology of this embodiment, and devices as a resultant product constitute one aspect of this invention. The present invention intends to cover devices as intermediate and final products of this device manufacturing method. Such devices include semiconductor chips such as LSI, VLSI and the like, CCDs, LCDs, magnetic sensors, thin film magnetic heads, and the like.

Thus, these embodiments can provide a processing apparatus that has good overlay accuracy, fine processing and economical efficiency, and can prevent resist's contaminations.

Further, the present invention is not limited to these preferred embodiments, and various variations and modifications may be made without departing from the scope of the present invention.

What is claimed is:

1. A processing apparatus for transferring a pattern on a mold to a resist on a substrate through a compression of the mold against the resist, said processing apparatus comprising:
   a holder for holding the mold;
   a supplier for supplying the resist to the substrate or the mold, and
   a recovery unit for recovering via a recovery port the resist supplied by the supplier, the recovery port being provided in a surface of the holder,
   wherein part of the mold is located outside the substrate, and the mold is driven relative to the substrate with only part of the pattern being transferred to the resist.

2. The processing apparatus according to claim 1, wherein the recovery port is located at an outer peripheral part of a portion for holding the mold of the holder.

3. The processing apparatus according to claim 1, wherein the recovery unit includes:
   a base provided with the recovery port for recovering the resist; and
   vacuum pumping unit connected to the recovery port.

4. The processing apparatus according to claim 1, wherein the recovery unit attracts part of the mold.

5. The processing apparatus according to claim 1, further comprising a member for irradiating light for curing the resist, and said processing apparatus serves as an imprint apparatus.

6. A device manufacturing method comprising the steps of:
   transferring a pattern onto resist on a substrate by using a processing apparatus; and
   etching the substrate,
   wherein said processing apparatus transfers a relief pattern on a mold to a resist on a substrate through a compression of the mold against the resist, said processing apparatus comprising:
   a supplier for supplying the resist between the substrate and the mold; and
   a recovery unit for recovering the resist, and
   wherein part of the mold is located outside the substrate, and the mold is driven relative to the substrate with only part of the pattern being transferred to the resist.

* * * * *